United States Patent
Holzapfel et al.

[11] Patent Number: 5,973,620
[45] Date of Patent: Oct. 26, 1999

[54] CONTROL DEVICE AND PROCESS FOR TESTING POSITION DEPENDENT SIGNALS OF A POSITION MEASURING DEVICE

[75] Inventors: Wolfgang Holzapfel, Obing; Alois Huber, Nussdorf; Robert Bernhard, Garching/Alz, all of Germany

[73] Assignee: Dr. Johannes Heidenhain GmbH, Traunreut, Germany

[21] Appl. No.: 08/947,803

[22] Filed: Oct. 9, 1997

[30] Foreign Application Priority Data

Oct. 12, 1996 [DE] Germany .................... 196 42 199

[51] Int. Cl.$^6$ .................................................. H03M 1/30
[52] U.S. Cl. ..................... 341/11; 324/121 R; 341/114
[58] Field of Search .................. 341/11, 114; 324/88, 324/91, 121 R

[56] References Cited

U.S. PATENT DOCUMENTS

| | | | |
|---|---|---|---|
| 3,985,980 | 10/1976 | Bradley | 324/121 R |
| 4,360,730 | 11/1982 | Breslow | 250/231 SE |
| 4,648,113 | 3/1987 | Horn et al. | 381/1 |
| 5,128,609 | 7/1992 | Howley | 324/121 R |
| 5,241,173 | 8/1993 | Howley et al. | 250/231.16 |
| 5,508,607 | 4/1996 | Gibson | 324/121 R |
| 5,789,913 | 8/1998 | Mager | 324/76.79 |
| 5,793,201 | 8/1998 | Nelle et al. | 324/207.14 |

FOREIGN PATENT DOCUMENTS

| | | |
|---|---|---|
| 0 514 081 B1 | 2/1996 | European Pat. Off. |
| 43 36 767 A1 | 5/1994 | Germany. |
| 02036313 | 6/1990 | Japan. |
| WO 90/02956 | 3/1990 | WIPO. |

*Primary Examiner*—Marc S. Hoff
*Attorney, Agent, or Firm*—Brinks Hofer Gilson & Lione

[57] ABSTRACT

In the installation of a scanner of a position measuring apparatus, it is required that parameters such as amplitude and phase position of analog signals generated by a scanner be tested so that the scanner can be correctly installed. For this purpose, a control device with a display field is provided. In the display field, a bar is displayed whose width represents a measure for the range of variation of the radius and whose position represents a measure for the average radius of a Lissajous figure. In addition, a marking is displayed for the admissible range of variation of this radius.

24 Claims, 4 Drawing Sheets

CONTROL DEVICE AND PROCESS FOR TESTING POSITION DEPENDENT SIGNALS OF A POSITION MEASURING DEVICE

FIELD OF THE INVENTION

The invention relates to a control device and a process for testing position-dependent signals generated by a scanner of a position measuring device to ensure that the signals are accurately in a 90° phase relationship with respect to one another and that the signals have substantially the same amplitude.

BACKGROUND OF THE INVENTION

It is particularly important to test the signals generated by a scanner of a position measuring device in order to correctly install the scanner. It is well known to provide a position measuring device having a scanner and scale to determine the position of a movable part, such as a machine, relative to a fixed part. Typically, the scanner outputs two analog signals in quadrature. These outputs can be fed to further circuitry for counting the cycles of the incoming signals so as to determine position, to determine the direction of movement, and to provide position interpolation within one cycle of the output. It is desirable that the scanner be installed correctly aligned relative to the scale so that the output signals from the scanner are accurately in quadrature with a 90° phase shift and have substantially the same amplitude. Signal quality and the precision of measurement depends greatly on the correct installation of the scanner relative to the scale. The amplitude of the signals generated by the scanner is influenced by the distance between the scanner and scale and the phase shift is influenced by the tilt of the scanner relative to the direction of measurement.

In order to test the correct positioning of the scanner relative to the scale it is known to display the amplitude and phase shift of the analog signals generated by a scanner on an oscilloscope. The two analog signals output by the scanner are input to two channels of a double beam oscilloscope so that a Lissajous figure is generated. The radius of the Lissajous figure is a measure of the amplitude as well as the phase relation of the analog signals. If the scanner is perfectly positioned with respect to the scale, the Lissajous figure will be a perfect circle centered at the origin.

In order to simplify the testing of the signals generated by a scanner, U.S. Pat. No. 5,128,609 discloses a control device having a bar display. In this control device, a radius of the Lissajous figure is calculated from the instantaneous amplitudes of the analog signals generated by a scanner and the instantaneous radius value is represented as a lighted point on the bar display. While this control device is easier to handle than an oscilloscope, the bar display does not provide sufficient resolution to allow one to make fine adjustments in the scanner's position.

During the installation of a scanner relative to a scale, the amplitudes of the analog signals generated by the scanner can range from zero to a maximum of, for example, 12 $\mu$A. This relatively large range must be able to be displayed in order for the analog signals to be tested. However, because of space limitations, displaying such a large range compromises the resolution of the display. This has the disadvantage that the range of variation of the radius of the Lissajous figure cannot be represented with sufficient resolution and precision since the instantaneous radius value appears only as a single lighted point.

An object of the present invention is to provide a control device and a process for testing position-dependent analog signals where the parameters of the analog signals can be displayed with sufficiently high resolution and precision.

An advantage of the present invention is that important parameters of the analog signals can be better recognized and thus, in a simple way, a good quality of analog signals can be obtained.

SUMMARY OF THE INVENTION

According to a first aspect of the invention there is provided an apparatus for testing analog signals generated by a scanner so that the scanner can be correctly installed in a position measuring device. The apparatus includes a control device coupled to the scanner which receives as inputs the analog signals generated by the scanner wherein the analog signals each have an amplitude and a phase wherein the control device calculates (1) a series of radius values R from the amplitudes and phase from the analog signals and (2) a range value for the range of variation of the calculated radius values R; and a display coupled to the control unit wherein the range value is displayed.

According to a second aspect of the invention there is provided an apparatus for testing analog signals generated by a scanner so that the scanner can be correctly installed in a position measuring device. The apparatus includes a control device coupled to the scanner which receives as inputs the analog signals generated by the scanner wherein the analog signals each have an amplitude and a phase wherein the control device calculates a magnitude corresponding to a radius R of a Lissajous figure; and a display coupled to the control unit wherein the display displays the magnitude calculated by the control unit as well as a marking indicating an allowable range for the magnitude.

According to a third aspect of the invention there is provided a method for testing analog signals generated by a scanner of a position measuring device so that the scanner can be correctly installed in the position measuring device. The method includes the steps of: a) calculating a series of radius values from instantaneous values of the analog signals; b) calculating a range of variation from a predetermined number of the radius values calculated in step (a); and c) displaying a bar representing the range of variation calculated in step (b).

According to a fourth aspect of the invention there is provided a method for correctly installing a scanner in a position measuring device. The method includes the steps of: a) generating analog signals with the scanner; b) calculating a series of radius values from instantaneous values of the analog signals; c) calculating a range of variation from a predetermined number of the radius values calculated in step (b); d) displaying a bar representing the range of variation calculated in step (c) on a display; and e) adjusting the position of the scanner until the bar displayed in step (d) is as narrow as possible and located at one extreme of the display.

DETAILED DESCRIPTION OF THE PRESENTLY PREFERRED EMBODIMENTS

Figure 1:
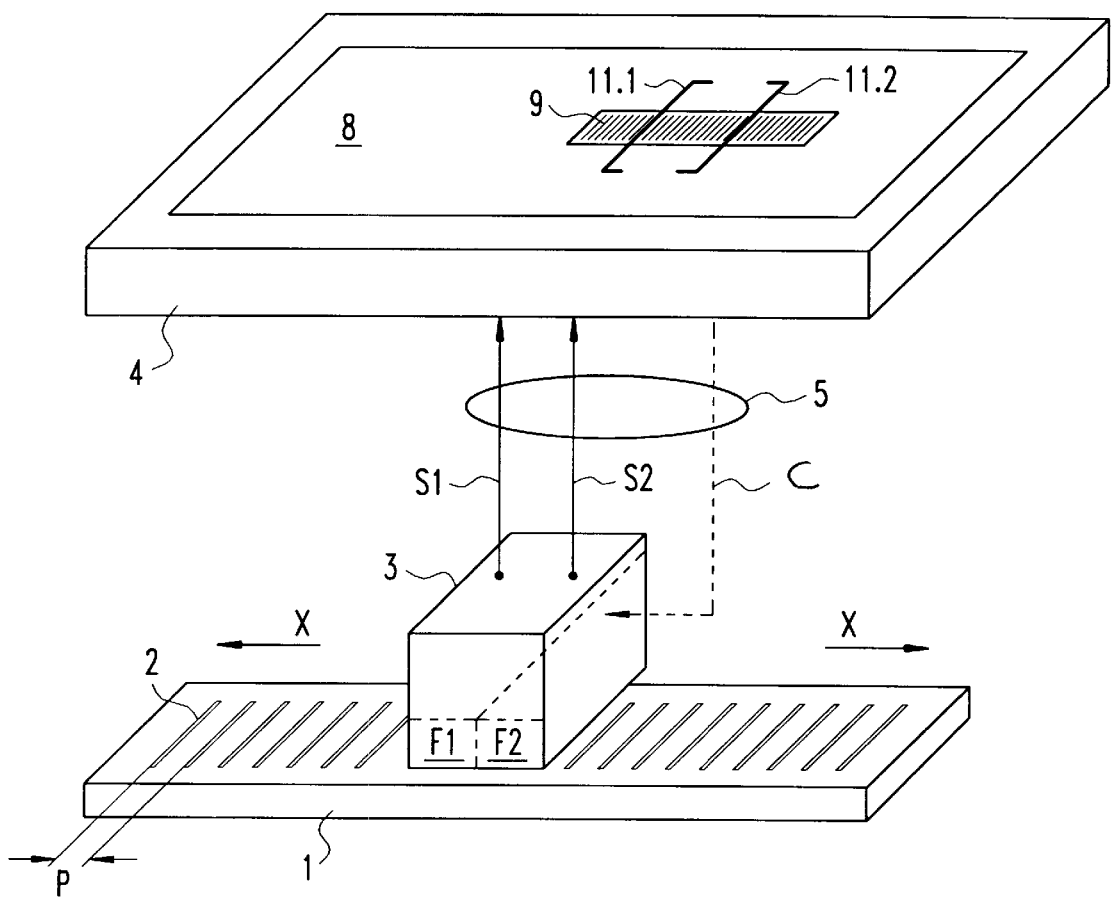
FIG. 1 is a schematic illustration of a position measuring system having a control device according to a preferred embodiment of the present invention.

FIG. 1 is a schematic illustration of a position measuring system having a control device according to a preferred embodiment of the present invention. The position measuring system includes a scale 1, a scanner 3 and a control device 4. The scale 1 has an incremental graduation 2 disposed thereon which has a graduation period P. In a preferred embodiment the scale 1 and graduation 2 are designed to measure linear movement, however, angular movement may be measured using a radial scale. The scanner 3 has scanning elements F1 and F2 that scan the incremental graduation 2 of the scale 1. The scanning elements F1, F2 may be optoelectric, magnetic, capacitive or inductive elements, for example. The control device 4 has a display field 8 on which a bar 9 and brackets 11.1, 11.2 can be displayed as will be described in greater detail hereinafter. The control device 4 and scanner 3 are coupled together by output lines 5.

Before any actual measurements are performed, the scanner 3 must be correctly installed. To that end the analog signals S1, S2 are input to the control unit 4. After it has been determined that the scanner 3 has been correctly installed, position measuring can be performed by connecting the scanner 3 with an evaluation unit (not shown) which interpolates the analog signals S1, S2.

During the measurement operation, the scanning elements F1, F2 of the scanner 3 scan the incremental graduation 2 and output two analog signals S1, S2 that are preferably phase-shifted with respect to one another by 90° and preferably have substantially the same amplitude. These analog signals S1, S2 are interpolated in an interpolation unit (not shown) in order to obtain a position measuring value whose resolution is better than one period P of the incremental graduation 2 as is well known to those of ordinary skill in the art. In a preferred embodiment digital computers (not shown) are used to process the analog signals S1, S2. In order to obtain an interpolation with high precision it is necessary that the analog signals S1, S2 where S1=A1·sin (wt) and S2=A2·cos(wt) be phase-shifted exactly by 90° and have as high a signal amplitude A1, A2 as possible, and that the signal amplitudes of both analog signals are as nearly equal as possible. To ensure that these parameters are satisfied the scanner 3 must be correctly positioned with respect to the scale 2. Thus, during installation of the scanner, the analog signals generated by the scanner need to be tested. According to the present invention the control device 4 allows the parameters of the analog signals, i.e., phase shift and amplitude, to be displayed with high resolution so that fine adjustments in the scanner's position can be made.

Figure 2:
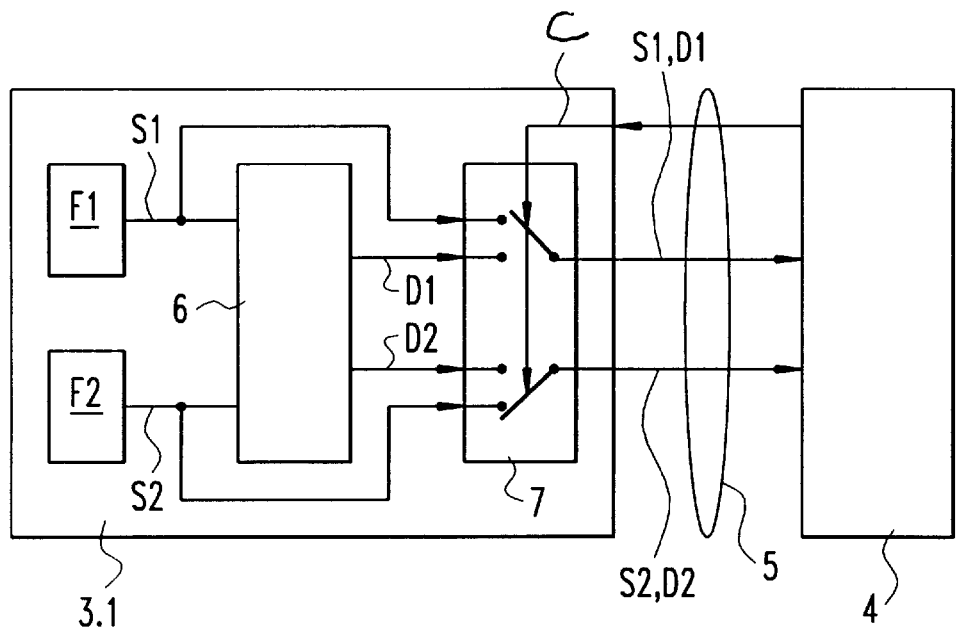
FIG. 2 is a schematic illustration of a digital scanner incorporated in the position measuring system shown in FIG. 1 according to a preferred embodiment of the present invention.

The scanner 3 may be either an analog scanner or a digital scanner. FIG. 2 is a schematic illustration of a digital scanner incorporated in the position measuring system shown in FIG. 1 according to a preferred embodiment of the present invention. The digital scanner 3.1 is coupled to the control device 4 over output lines 5. In a preferred embodiment the digital scanner 3.1 has scanning elements F1, F2 which are both coupled to an analog-to-digital converter unit 6 and a switching unit 7. The analog signals S1, S2 output from the scanning elements F1, F2 are input to the analog-to-digital converter unit 6 where they are digitized and output as digital signals D1, D2 respectfully. The analog signals S1, S2 are also input to switching unit 7. The control device 4 has an output line 5.1 coupled to the switching unit 7.

Even with a digital scanner 3.1 it is still possible to test the analog signals S1, S2 generated by the scanning elements F1, F2. For this purpose, a control signal C is output by the control device 4 to the digital scanner 3.1 which controls the switching unit 7 in order to transmit the analog signals S1, S2 instead of the digital signals D1, D2 to the control device 4, as shown, during testing. In order to automate the switching unit 7, the control signal C is always present at an output of the control device 4 so that as soon as an electrical connection is made between the digital scanner 3.1 and the control device 4, the control signal is present and causes the digital scanner 3.1 to output analog signals S1, S2 instead of digital signals D1, D2 so that it can be determined if the scanner has been properly installed.

Figure 3:
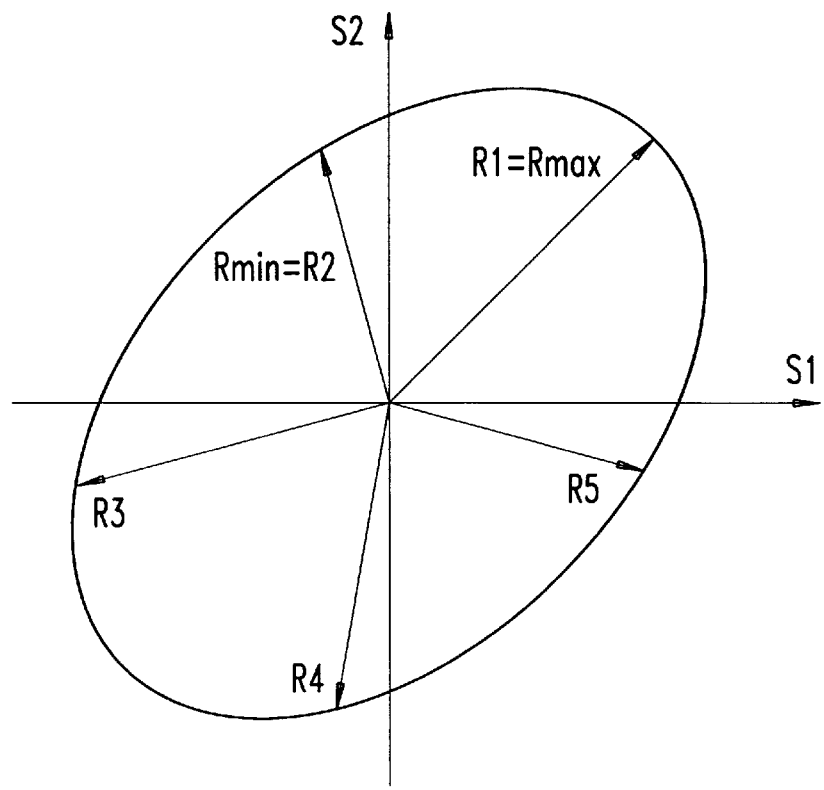
FIG. 3 is a graph of a Lissajous figure.

FIG. 3 is a graph of a Lissajous figure illustrating the parameters, i.e., amplitude and phase, of the analog signals S1, S2. The instantaneous radius R1 to R5 of the Lissajous figure shown are calculated according to the following equation:

$$Rn = \sqrt{S1_n^2 + S2_n^2}, \text{ where } n = 1, \ldots$$

After a predetermined number of radius values R1 to R5 have been calculated and stored, a minimum radius value $R_{min}$ and a maximum radius value $R_{max}$ are calculated. It is particularly advantageous if it is assured that the group of radius values R1 to R5 from which $R_{min}$ and $R_{max}$ are calculated, have at least one radius value R within each of the four quadrants of the Lissajous figure. In order to monitor this, $R_{min}$ and $R_{max}$ may only be calculated if at least one radius value lies within a quadrant so that every quadrant has a radius value. If the scanner 3 is perfectly positioned with respect to the scale, the Lissajous figure will be a perfect circle of constant radius centered at the origin otherwise it will not have a constant radius as shown in FIG. 3.

Figure 4:
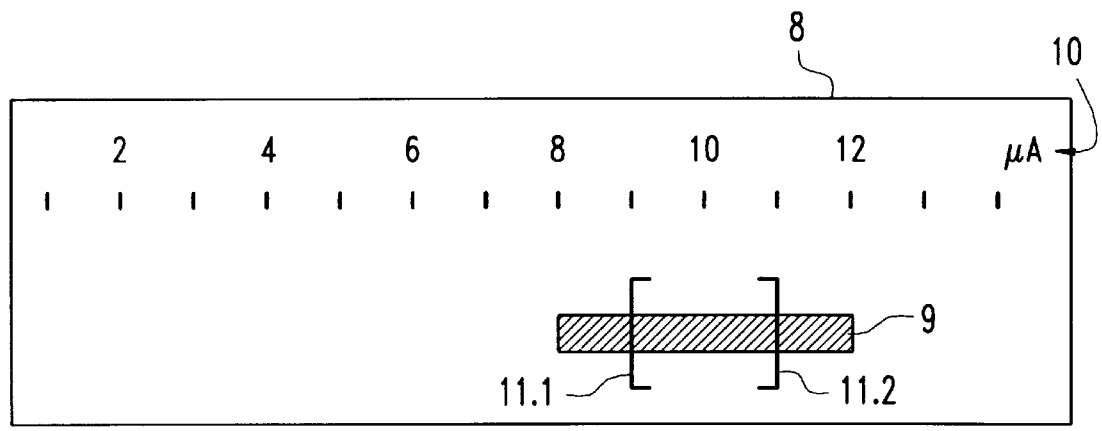
FIG. 4 illustrates a display field of the control device according to a preferred embodiment of the present invention.

FIG. 4 illustrates an example of a display that can be displayed on the display field 8 of the control device 4. With a relative shift of the scanner 3 relative to the scale 1 in the direction of measurement X, several measured values for the radius R are determined in a predetermined time reference. For example, the control device 4 determines that $R_{min}$=8 μA and $R_{max}$=12 μA from these measured values. A continuous bar 9 extending from 8 μA to 12 μA is displayed in the display field 8 as shown. If $R_{min}$ and $R_{max}$ change in subsequent measurements, then the range of the bar 9 will also change. In a preferred embodiment, a scale 10 of possible radius values R is also displayed.

In a preferred embodiment it is also desirable to display a marking 11 in the form of brackets 11.1, 11.2, for indicating the theoretical width of the bar 9, i.e., the admissible tolerance of the range of variation of the radius value R. If, for example, the admissible tolerance is ±10%, then the left bracket 11.1 is displayed superimposed over the bar 9 at 9 μA, and the right bracket 11.2 is displayed superimposed over the bar 9 at 11 μA. Other markings instead of the brackets 11.1 and 11.2 may be used. The position of the brackets 11.1 and 11.2 are calculated according to the following formula:

a) An average value radius, RM, is calculated from several sequential radius values R. The average value RM can be the arithmetic mean of several radius values R, or the value $(R_{min}+R_{max})/2$. In the example shown in FIG. 4, RM=10. A marking, for example, a line, point, or arrow may also be included in the display field 8 to indicate the average value RM.

b) The position of the left bracket 11.1 is calculated assuming the admissible range of variation is 10% of RM where the left bracket 11.1 is positioned at the value RM−10% of RM. In the example shown in FIG. 4, where the average value RM equals 10 $\mu$A, the admissible range of variation of the radius value is R=±1 $\mu$A so that the left bracket 11.1 is shown at 9 $\mu$A and the right bracket 11.2 is shown at 11 $\mu$A.

Since the admissible tolerance is determined as a % of RM, the range included between the right and left bracket 11.1, 11.2 changes as a function of the instantaneous average value RM.

During the testing of the position measuring apparatus, in particular during the installation of the scanner 3, the distance of the scanner 3 to the scale 1 as well as its angular alignment is correct if the bar 9 displayed in the display field 8 appears as far to the right of the display field 8 as possible and has a narrow width that lies within the brackets 11. 1, 11.2.

Figure 5:
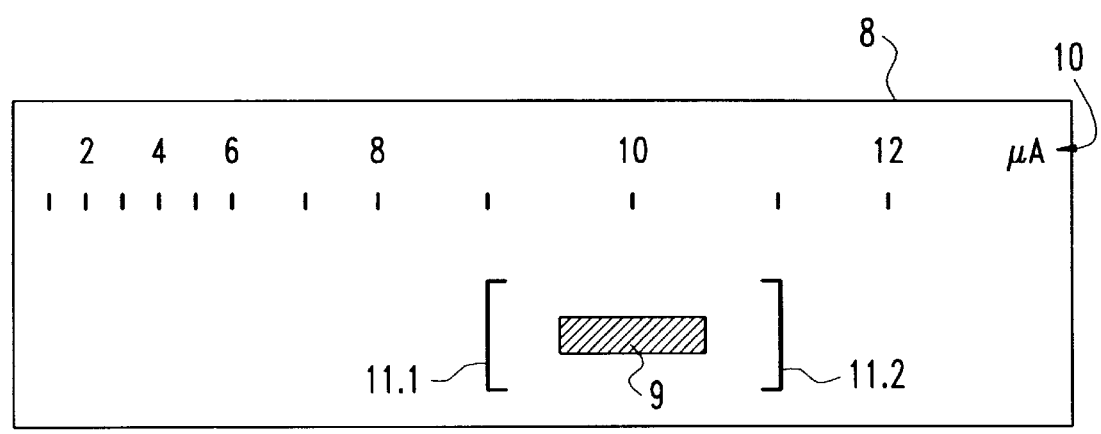
FIG. 5 illustrates a display field of the control device according to another preferred embodiment of the present invention.

In FIG. 5, a display field according to another preferred embodiment is shown. In this display field, the right hand portion of the measure 10 is exaggerated. In this example, the minimum and maximum range are well within the particularly important range of the theoretical value indicated by brackets 11.1, 11.2. This enlarged representation within a limited range simplifies the fine adjustment of the scanner 3. Small deviations and changes of the position of the bar 9 for example, at 10 $\mu$A are recognized more rapidly. In particular, the range of variation of the radius, thus the width of the bar, can be represented particularly clearly and thus equalization of the two amplitudes of the two sampling signals S1, S2 can be easily detected.

Figure 6:
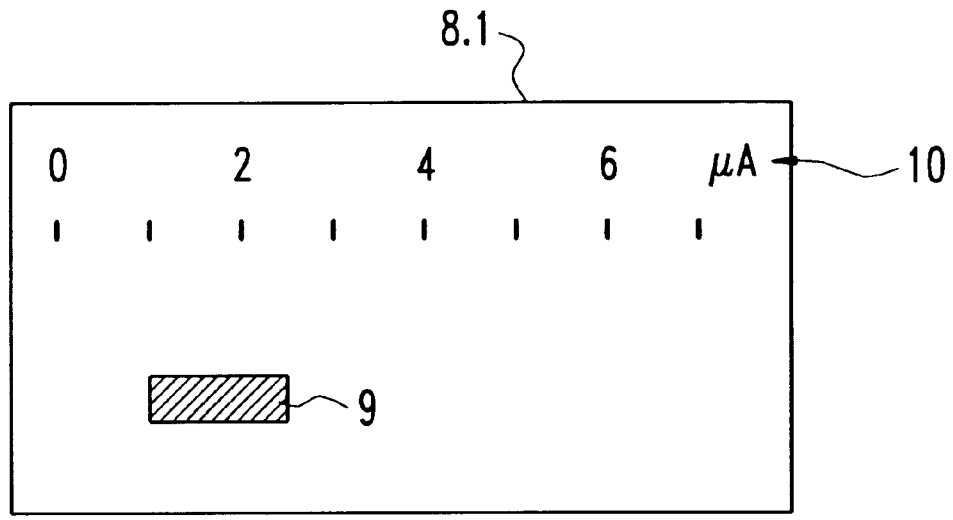
FIGS. 6 and 7 illustrate two states of a display field of the control device according to yet another preferred embodiment of the present invention.
Figure 7:
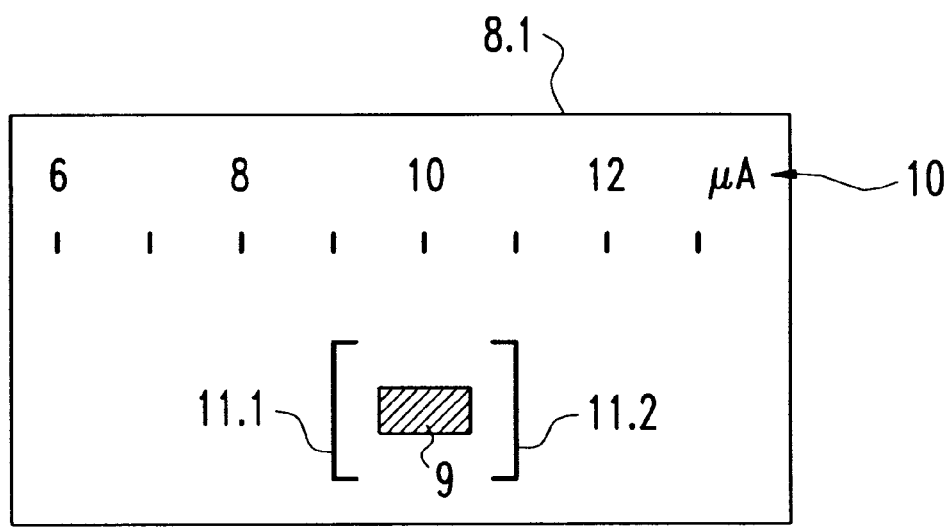

FIG. 6 and 7 illustrate two states of a display field 8 of the control device according to another preferred embodiment of the invention is shown. As shown in FIG. 6 and 7 different smaller sections of the measure 10 are displayed. In FIG. 6 the measure 10 extends from 0–7 $\mu$A and in FIG. 7 the measure 10 extends from 7–13 $\mu$A. In order to accomplish this selectivity in the display a switching unit (not shown) is provided in the control device 4. If it is determined that the maximum radius value $R_{max}$ lies below a limiting value of, for example, 7 $\mu$A, then a range of values from 0 to 7 $\mu$A is displayed in the display field 8 as the measure 10, as shown in FIG. 6. If it is determined that the minimum radius $R_{min}$ lies above a limiting value of, for example, 6 $\mu$A, then a range of values from 6 $\mu$A to 13 $\mu$A is displayed within the same display field 8 as shown in FIG. 7. In a preferred embodiment the switching of the display is essentially a function of the instantaneous position of the bar 9. The switching between displays can be performed as a function of the registered instantaneous values of R, as a function of $R_{min}$ or $R_{max}$ for several registered radius values R, or as a function of a calculated average value RM from several radius values. It is particularly advantageous if in the first state of the display (FIG. 6), a lower range of radius values is displayed in which the amplitudes of the sampling signals S1, S2 are insufficient and in the second state (FIG. 7) an upper range of radius values is displayed in which the amplitudes of the sampling signals S1, S2 have reached a sufficient value. In this second state the range of variation of the radius can then be observed and set particularly precisely in the display field 8. For this reason it is also possible that the measure 10 and the range of variation of the bar 9 in the second state with respect to the first state is shown enlarged.

In all of the preferred embodiments, it is also possible that the range of variation, i.e., the width of the bar 9, can be shown enlarged with respect to its position because it is especially important that the range of variation be as small as possible. In an example explained this means that for determined radius values $R_{min}$=9 $\mu$A and $R_{max}$=11 $\mu$A, the average value RM=10 $\mu$A is calculated and the average position of the bar 9 is also represented at 10 $\mu$A. The enlarged representation of the range of variation is realized by the width of the bar 9 being shown wider, perhaps by a factor of 2, thus the left end is located at RM−2(RM−$R_{min}$)=8 $\mu$A and the right end is located at RM+2($R_{max}$−RM)=12 $\mu$A.

As described with reference to the three examples of the display fields shown in FIGS. 4–7, the width of the bar 9 represents the deviation between several radius values R. This deviation can be the difference between $R_{min}$ and $R_{max}$ or, for example, the standard deviation between several radius values R.

The bar 9 can also be displayed without the specification of measure 10 so that the operator only has to take care that the bar 9 is as narrow as possible and comes to rest as far to the right as possible.

Alternatively, the bar 9 can also be displayed in a way that its position in one direction of the display field 8 specifies the average radius RM and, in a direction perpendicular thereto, the bar 9 has a width that specifies the range of variation of the radius R.

In the installation of the scanner 3 it has been shown that it is advantageous if for coarse adjustment of the scanner 3 the bar 9 is displayed as rapidly as possible and for fine adjustment of the scanner the bar 9 is shown as precisely as possible. For this reason it is preferred that the range of variation at radius values below a predetermined value, for example 50% of the theoretical value, is calculated from a smaller number of radius values (for example 5 values) and above this predetermined value from a larger number of radius values (for example 20 values).

In the examples, it was presumed that the analog signals S1, S2 were phase-shifted with respect to one another by 90°. The invention, however, can also be used if the phase shift of the analog signals S1, S2 deviates from 90°. Generally the instantaneous radius R of the Lissajous figure is calculated from the following equation:

$$R = \sqrt{S1^2 + S2^2 - 2(S1 \cdot S2 \cdot \cos\phi)},$$

where $\phi$ is the phase shift of analog signals S1 and S2.

There are also position measuring apparatuses 1, 3 that utilize three analog sinusoidal signals S3, S4, S5 each phase-shifted with respect to the other by 120°. In order to be able to process these analog signals S3, S4, and S5 in a typical interpolation and counting devices, these analog signals S3, S4, and S5 are converted before further processing into the analog signals S1, S2 phase shifted by 90° which can be used with the present invention. It is also possible to use analog signals S3, S4, S5 phase shifted with respect to one another by 120° in the manner described above. The instantaneous radius R of the Lissajous figure is calculated by the following equation:

$$R = \frac{2}{3} \cdot \sqrt{S3^2 + S4^2 + S5^2 - S3 \cdot S4 - S4 - S3 \cdot S5 - S4 \cdot S5}$$

In a preferred embodiment the display field 8 is a liquid crystal display, i.e., an LCD, however, fluorescent displays, LED lines, and an LED matrix may be used.

The control device 4 with the display field 8 can be an integral component of the scanner 3 itself so that the bar is displayed on a surface of the scanner 3. In the display field 8 different colors may be used to display different parameters. The control device can also be operated independently of external power supply sources by incorporating an integrated battery.

While this invention has been shown and described in connection with the preferred embodiments, it is apparent that certain changes and modifications, in addition to those mentioned above, may be made from the basic features of the present invention. Accordingly, it is the intention of the Applicants to protect all variations and modifications within the true spirit and valid scope of the present invention.

What is claimed is:

1. An apparatus for testing analog signals generated by a scanner so that the scanner can be correctly installed in a position measuring device, the apparatus comprising:
   a control device coupled to the scanner wherein the control device receives as inputs analog signals generated by the scanner wherein the analog signals each have an amplitude and a phase wherein the control device calculates (1) a series of radius values R from the amplitudes and phase from the analog signals and (2) a range value for the range of variation of the calculated radius values R; and
   a display coupled to the control unit wherein the range value is displayed.

2. An apparatus according to claim 1 wherein the range value is displayed as a bar having a width proportional to the value for the range.

3. An apparatus according to claim 2 wherein the width of the bar is represented on a larger scale than the position of the bar being changed within the display field.

4. An apparatus according to claim 2 wherein the width of the bar as well as its position of the bar being changed within the display field is represented in the range of a theoretical value of position on a larger scale than in the usual range.

5. An apparatus according to claim 1 wherein the control device also calculates an average radius from a predetermined number of radius values R and the bar is displayed with its center located at the calculated average radius.

6. An apparatus according to claim 1 wherein each radius value R is calculated from the instantaneous amplitude of two sinusoidal analog signals that are phase-shifted with respect to one another by 90° according to the equation $R = \sqrt{S1^2 + S2^2}$, where S1 and S2 are the instantaneous amplitudes of two analog signals.

7. An apparatus according to claim 1 wherein the range value is the difference between a maximum radius value ($R_{max}$) and a minimum radius value ($R_{min}$) determined from the series of radius values R.

8. An apparatus according to claim 1 further comprising a measure displayed in the display wherein the measure extends from a minimum to a maximum of possible radius values R.

9. An apparatus according to claim 1 further comprising a marking displayed in the display wherein the marking indicates an admissible range of variation of the radius values.

10. An apparatus according to claim 9 wherein the marking comprises a left and a right bracket.

11. An apparatus according to claim 9 wherein the marking comprises a lower marking and an upper marking, wherein the control device calculates an average radius value (RM) from the series of radius values R, and stores a value for an admissible range of variation, and calculates from the average radius value (RM) and the stored value the position of the lower and upper markings.

12. An apparatus according to claim 11 wherein the stored value for the admissible range of variation has a relative magnitude dependent on the average radius value (RM) so that the distance of both markings is displayed as a function of the determined average radius value (RM).

13. An apparatus according to claim 11 further comprising a switching unit coupled to the display to switch the range of the radius value R displayed in response to the minimum radius value $R_{min}$, the maximum radius value $R_{max}$, or the average radius value RM.

14. An apparatus according to claim 13 wherein the switching unit causes the control device to display the range of variation in either a first frame or in a second frame in the display field wherein in the first frame $R_{max}$ of the series of radius values lies below a predetermined value and in the second frame $R_{min}$ of the series of radius values lies above a predetermined value.

15. An apparatus according to claim 1 wherein the display is a liquid crystal display.

16. An apparatus according to claim 1 wherein the scanner is a digital scanner and the apparatus further comprises a switching unit coupled to the scanner wherein the switching unit controls whether analog or digital signals are output from the scanner.

17. An apparatus for testing analog signals generated by a scanner so that the scanner can be correctly installed in a position measuring device, the apparatus comprising:
   a control device coupled to the scanner wherein the control device receives as inputs the analog signals generated by the scanner wherein the analog signals each have an amplitude and a phase wherein the control device calculates a magnitude corresponding to a radius R of a Lissajous figure; and
   a display coupled to the control device wherein the display displays the magnitude calculated by the control device as well as a marking indicating an allowable range for the magnitude.

18. An apparatus according to claim 17 wherein the scanner is a digital scanner and the apparatus further comprises a switching unit coupled to the scanner wherein the switching unit controls whether analog or digital signals are output from the scanner.

19. An apparatus according to claim 17 wherein the display is a liquid crystal display.

20. A method for testing analog signals generated by a scanner of a position measuring device so that the scanner can be correctly installed in the position measuring device, the method comprising the steps of:
   a) calculating a series of radius values from instantaneous values of analog signals generated by a scanner;
   b) calculating a range of variation from a predetermined number of the radius values calculated in step a); and
   c) displaying a bar representing the range of variation calculated in step b).

21. A method according to claim 20 further comprising the steps of:
   d) calculating an accepted tolerance range for the range of variation calculated in step b); and e) displaying a mark indicating the tolerance range calculated in step d).

22. A method according to claim 20 further comprising the step of displaying a measure.

23. A method for correctly installing a scanner in a position measuring device, the method comprising the steps of:
   a) generating analog signals with the scanner;
   b) calculating a series of radius values from instantaneous values of the analog signals;
   c) calculating a range of variation from a predetermined number of the radius values calculated in step b);
   d) displaying a bar representing the range of variation calculated in step c) on a display; and
   e) adjusting the position of the scanner until the bar displayed in step d) is as narrow as possible and located at one extreme of the display.

24. A method according to claim 23 further comprising the steps of:
   f) calculating the average radius from a predetermined number of radius values calculated in step b);
   g) displaying the center of the bar displayed in step d) at the average radius calculated in step f).

* * * * *